United States Patent
Garnier et al.

(10) Patent No.: US 6,989,694 B2
(45) Date of Patent: *Jan. 24, 2006

(54) VOLTAGE RAMP GENERATOR AND CURRENT RAMP GENERATOR INCLUDING SUCH A GENERATOR

(75) Inventors: Christophe Garnier, Theys (FR); Pascal Debaty, Domene (FR)

(73) Assignee: STMicroelectronics SA, Gentilly (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 79 days.

(21) Appl. No.: 09/499,060

(22) Filed: Feb. 4, 2000

(65) Prior Publication Data

US 2002/0135407 A1    Sep. 26, 2002

(30) Foreign Application Priority Data

Feb. 4, 1999    (FR) .................................. 99 01306

(51) Int. Cl.
  *G05F 3/02*   (2006.01)
(52) U.S. Cl. ...................... 327/142; 327/349; 327/541
(58) Field of Classification Search ................ 323/316, 323/315; 327/131, 132, 134, 349, 540, 541, 327/543, 538, 133
See application file for complete search history.

(56) References Cited

U.S. PATENT DOCUMENTS

| RE30,737 | E | * | 9/1981 | Caron ................... 123/406.59 |
|---|---|---|---|---|
| 4,626,702 | A | * | 12/1986 | Chito ......................... 327/132 |
| 4,673,867 | A | * | 6/1987 | Davis ......................... 323/315 |
| 4,766,367 | A | * | 8/1988 | Saller et al. ................ 323/315 |
| 4,785,262 | A |   | 11/1988 | Ryu et al. .................... 331/111 |
| 4,803,381 | A | * | 2/1989 | Gornati et al. .............. 327/132 |
| 4,814,724 | A | * | 3/1989 | Tanigawa .................... 323/315 |
| 5,115,187 | A | * | 5/1992 | Hayashi ...................... 323/315 |
| 5,130,582 | A |   | 7/1992 | Ishihara et al. |
| 5,254,957 | A | * | 10/1993 | Lauffenburger ............. 330/252 |
| 5,808,484 | A | * | 9/1998 | Phillips et al. .............. 327/131 |
| 5,825,218 | A | * | 10/1998 | Colli et al. .................. 327/132 |
| 5,926,042 | A | * | 7/1999 | Talaga, Jr. .................. 327/132 |
| 5,969,513 | A | * | 10/1999 | Clark ......................... 323/312 |
| 5,990,727 | A | * | 11/1999 | Kimura ....................... 327/513 |

* cited by examiner

*Primary Examiner*—Terry D. Cunningham
(74) *Attorney, Agent, or Firm*—Lisa K. Jorgenson; Allen, Dyer, Doppelt, Milbrath & Gilchrist, P.A.

(57) ABSTRACT

A voltage ramp generator includes a capacitance and a charging circuit that permits generation of a charging current for the capacitance. The charging circuit for the capacitance includes a current generator having a resistance Rg2. The charging circuit for the capacitance includes components, such as resistance Re, that enables the capacitance charging current to be proportional to $(Re/Rg2)^2$. The voltage ramp generator is applicable to circuits for DC voltage converters operating in a current mode.

27 Claims, 3 Drawing Sheets

VOLTAGE RAMP GENERATOR AND CURRENT RAMP GENERATOR INCLUDING SUCH A GENERATOR

FIELD OF THE INVENTION

The present invention relates to a voltage ramp generator, and to a current ramp generator that converts the voltage ramp generator into the current ramp generator. The present invention has a particularly advantageous application for DC voltage converters operating in a current mode, for example.

BACKGROUND OF THE INVENTION

Circuits for DC voltage converters operating in a current mode include a regulation circuit that includes a current ramp generator necessary to stabilize the regulation circuit. It is therefore necessary for the current ramp generator to have only slight component and temperature variations.

A current ramp generator in accordance with the prior art is shown in FIG. 1. The current ramp generator is made up of a voltage ramp generator circuit and a circuit that enables the voltage ramp to be converted into a current ramp. The voltage ramp generator circuit is made up of a current generator Ig1 and a capacitance C. The current Ig1 charges the capacitance C in accordance with the equation:

$$\frac{\Delta Vc}{\Delta t} = \frac{1}{C} \times Ig1$$

where Vc is the voltage at the terminals of the capacitance C.

As is known to those skilled in the art, the current Ig1 can be written as:

$$Ig1 = K1 \times \frac{Vg1}{Rg1}$$

where Vg1 is a reference voltage such as a Bandgap voltage, for example, and Rg1 is the resistance of the current generator, and K1 is a proportionality coefficient.

The circuit permits the conversion of the voltage ramp into a current ramp, and is made up of an operational amplifier A, three transistors T1, T2, T3 and a resistance Rs. The operational amplifier A includes a first input (e−), a second input (e+) and an output. The transistor T1 is a N-type MOS transistor including a gate, a source and a drain, and the transistors T2 and T3 are P-type MOS transistors, each including a gate, a source and a drain.

The first input (e−) of the operational amplifier A is connected to the source of the transistor T1. The gate of which is connected to the output of the operational amplifier A, and the drain is connected to the drain of transistor T2. The second input (e+) of the operational amplifier A is connected to the first terminal of the capacitance C. The second terminal the capacitance C is connected to ground. The source of transistor T1 is connected to the first terminal of the resistance Rs, and the second terminal of which is connected to ground.

The transistors T2 and T3 are assembled as a current mirror. The source of transistor T2 is connected to a supply voltage V+. The drain and the gate of transistor T2 are connected to one another and to the gate of transistor T3. The source of transistor T3 is connected to the supply voltage V+, and the drain is connected to the circuit (not shown in the figure) which collects the current Is. Variation of the current Is is in relation to time which forms the current ramp.

In a known way, the variation of the current Is in relation to time is given by the equation:

$$\frac{\Delta Is}{\Delta t} = \frac{1}{C} \times \frac{Vg1}{Rg1} \times K1 \times \frac{1}{Rs}$$

It follows that the variation of the gradient ΔIs/Δt depends directly on the variations of resistances Rg1 and Rs and of the capacitance C. The resistances Rg1 and Rs can have a spread on the order of ±20%. These spreads are then reflected in the current ramp on the order of ±40%.

Prior approaches for correcting the current ramp spreads include adjusting the resistance Rs. It is then necessary to use a sequence of tests to adjust the value of resistance Rs. Provision is thus made to use fuse type memory points to adjust the ramp of each circuit. This adjustment is a tedious operation. Furthermore, the design of the resistance Rs produced as a combination of fuses requires a relatively large area of the circuit.

In addition, resistances Rg1 and Rs have temperature variations. These variations also have an impact on the current ramp. Since the adjustment of resistance Rs is only valid at the temperature at which it is carried out, the temperature dependence is not corrected.

BACKGROUND OF THE INVENTION

In view of the foregoing background, the present invention does not have the above described disadvantages. In effect, the invention relates to a voltage ramp generator comprising a capacitance and a charging circuit that permits the generation of a charging current for the capacitance. The charging circuit for the capacitance comprises a current generator of resistance Rg2. The charging circuit for the capacitance includes means that permit the charging current for the capacitance to be proportional to $(Re/Rg2)^2$, where Re is a resistance.

According to one particularly advantageous embodiment of the invention, the means that permit the charging current for the capacitance to be proportional to the quantity $(Re/Rg2)^2$ comprises a degenerate current mirror. The term degenerate current mirror is used to mean a current mirror whose current ratio is not equal to the ratio of the surface areas of the MOS transistors that makes it up.

The invention also relates to a current ramp generator comprising a voltage ramp generator and a circuit that permits the conversion of the voltage ramp to a current ramp. The voltage ramp generator is a voltage ramp generator such as the one mentioned above.

According to the preferred embodiment of the invention, the components forming the voltage ramp generator and the current ramp generator are produced using CMOS technology The invention also relates to where the components are produced using a different technology, such as bipolar technology, for example.

BRIEF DESCRIPTION OF THE DRAWINGS

Other characteristics and advantages of the invention will become apparent on reading a description of a preferred embodiment of the invention made making reference to the appended figures among which.

DETAILED DESCRIPTION OF THE PREFERRED EMBODIMENTS

Figure 2:
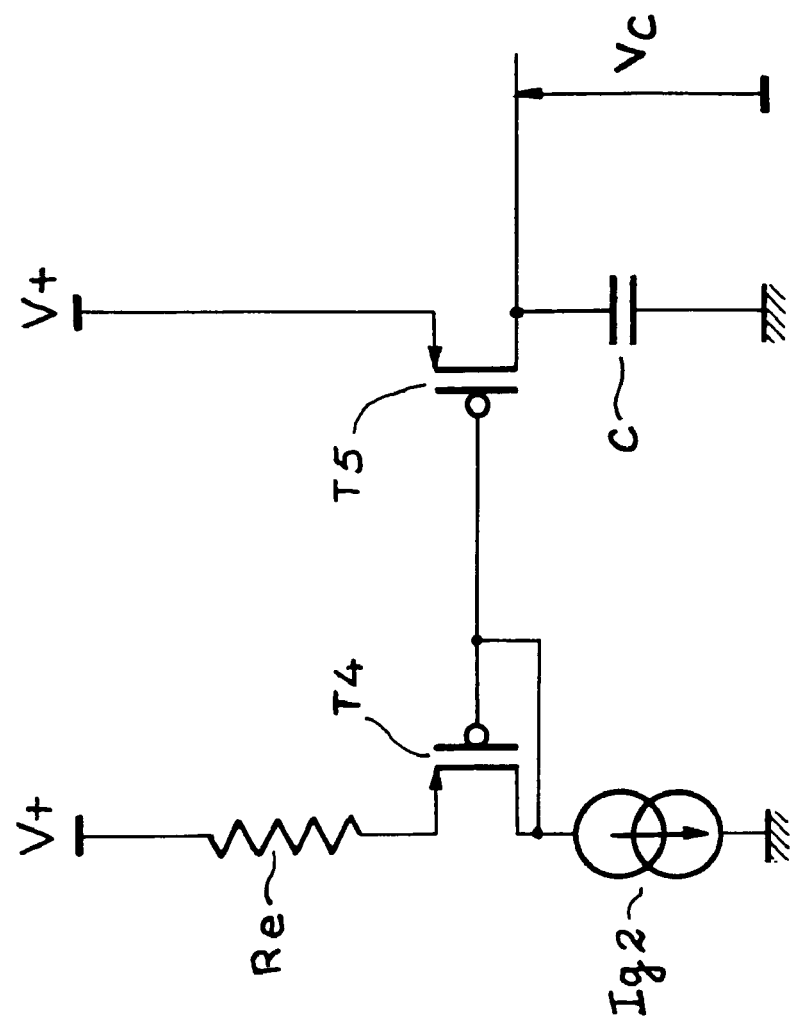
FIG. 2 shows a voltage ramp generator according to the preferred embodiment of the present invention.

In all the figures, the same reference numbers designate the same components. FIG. 2 represents a voltage ramp generator according to the preferred embodiment of the present invention. The voltage ramp generator circuit includes a current generator Ig2, a resistance Re, a capacitance C and two P-type MOS transistors T4 and T5 each comprising a gate, a drain and a source.

The transistor T4 has its source connected to a first terminal of the resistance Re, the second terminal of which is connected to a supply voltage V+. The drain and the gate of transistor T4 are connected to a first terminal of the current generator Ig2, the second terminal of which is connected to ground. The transistor T5 has its gate connected to the gate of transistor T4, its source connected to the supply voltage V+ and its drain connected to a first terminal of the capacitance C. The second terminal of the capacitance C is connected to ground.

Preferably, the substrate effect is suppressed on transistors T4 and T5, and the voltage threshold Vth4 of transistor T4 is equal to the voltage threshold Vth5 of transistor T5. Current Ig2 passes through the resistance Re. Therefore, it follows that:

$$Re \times Ig2 + VGST4 - Vth4 = VGST5 - Vth5,$$

where VGST4 is the gate/source voltage of transistor T4 and VGST5 is the gate/source voltage of transistor T5.

According to the invention, the resistance Re is chosen in such a way that:

$$Re \times Ig2 \gg VGST4 - Vth4,$$

It follows therefore:

$$VGST5 - Vth5 \approx Re \times Ig2,$$

In CMOS technology, the current which passes through the transistor T5 is written as:

$$I_{T5} = \frac{\mu \times Cox}{2} \times \frac{W}{L} \times (V_{GST5} - Vth5)^2,$$

where $\mu$ is the mobility of the carriers, Cox is the gate capacitance of the transistor T5, W is the channel width of transistor T5, L is the channel length of transistor T5.

It follows, therefore, that:

$$I_{T5} = \frac{\mu \times Cox}{2} \times \frac{W}{L} \times (Re \times Ig2)^2,$$

The current Ig2 can be written as:

$$Ig2 = K2 \times \frac{Vg2}{Rg2},$$

where Vg2 is a reference voltage, Rg2 is the resistance of the current generator and K2 is a proportionality coefficient.

Preferably, the voltage Vg2 is proportional to the quantity $$k\frac{T}{q},$$

where k is the Boltzmann constant, T is absolute temperature and q is the charge of an electron.

It follows, therefore, that:

$$I_{T5} = \frac{\mu \times Cox}{2} \times \frac{W}{L} \times \left(\frac{Re}{Rg2}\right)^2 \times K2^2 \times Vg2^2.$$

The current IT5 is the current which charges the capacitance C. The equation which translates the charge of the capacitance C is written as:

$$\frac{\Delta Vc}{\Delta t} = \frac{1}{C} \times \frac{\mu \times Cos}{2} \times \frac{W}{L} \times \left(\frac{Re}{Rg2}\right)^2 \times K2^2 \times Vg2^2.$$

The presence of the resistance Re advantageously permits compensation for the variations of the resistance Rg2. The resistances Re and Rg2 are chosen to be of the same type of technology, thereby allowing compensation for their spreads.

It is then possible, for example, to obtain a variation of the gradient $$\frac{\Delta Vc}{\Delta t}$$

on the order of ±25% for a variation of resistances Rg2 and Re, each on the order of ±40% in total. The resistance Re is preferably chosen with a temperature variation coefficient of the same order of magnitude as that for the resistance Rg2. It is then possible to compensate for variations in temperature due to the resistance Rg2. Preferably, as has been previously mentioned, the voltage Vg2 is proportional to the quantity $$k\frac{T}{q}.$$

The mobility of the carriers varies proportionately to $T^{-3/2}$. It follows that the voltage ramp $$\frac{\Delta Vc}{\Delta t}$$

varies proportionately to $T^{1/2}$.

Figure 3:
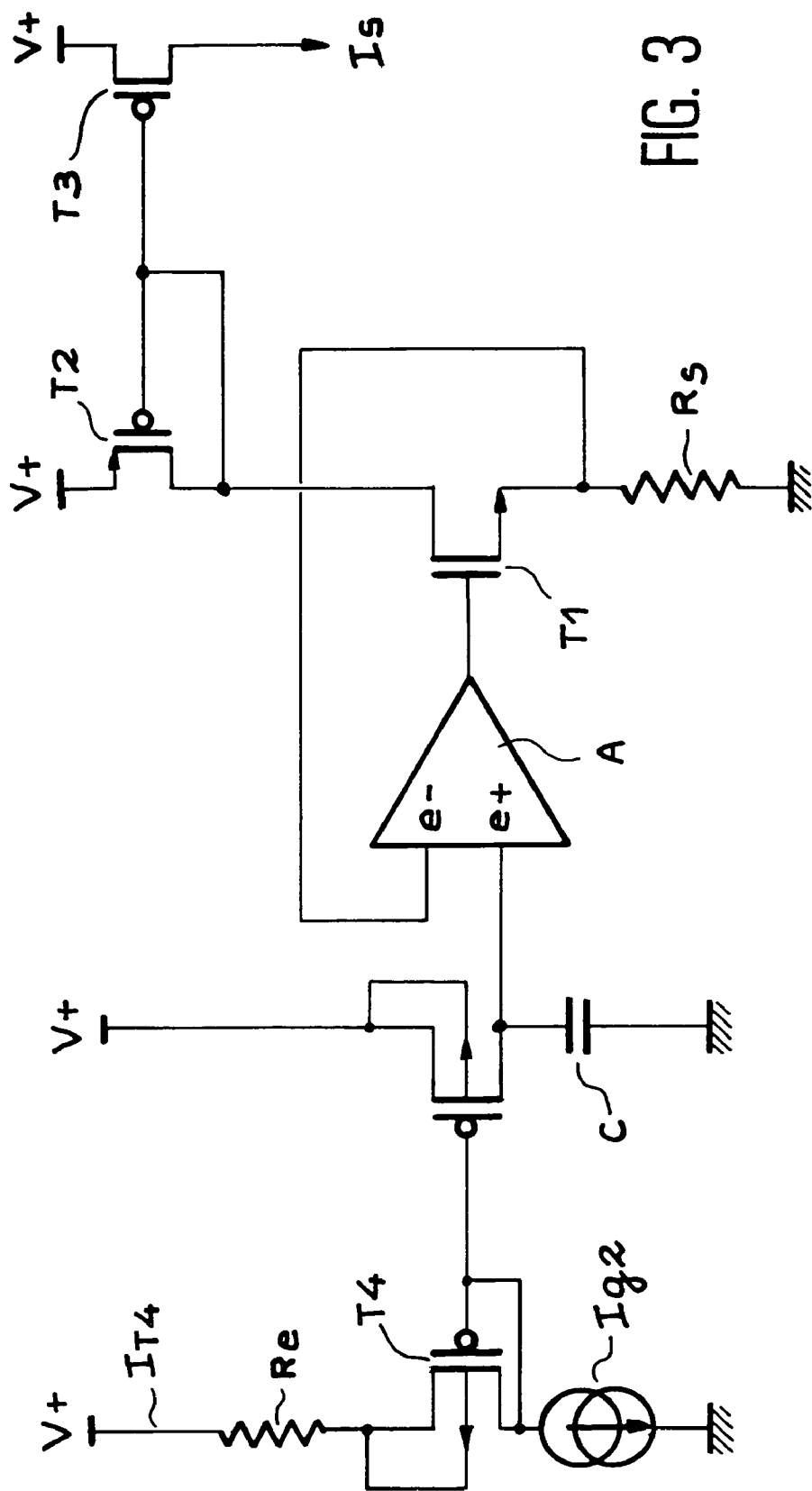
FIG. 3 shows a current ramp generator according to the preferred embodiment of the present invention.

FIG. 3 shows a current ramp generator according to the preferred embodiment of the invention. The current ramp generator includes a voltage ramp generator circuit such as that described in FIG. 2, and a circuit that allows the voltage ramp to be converted into a current ramp.

Figure 1:
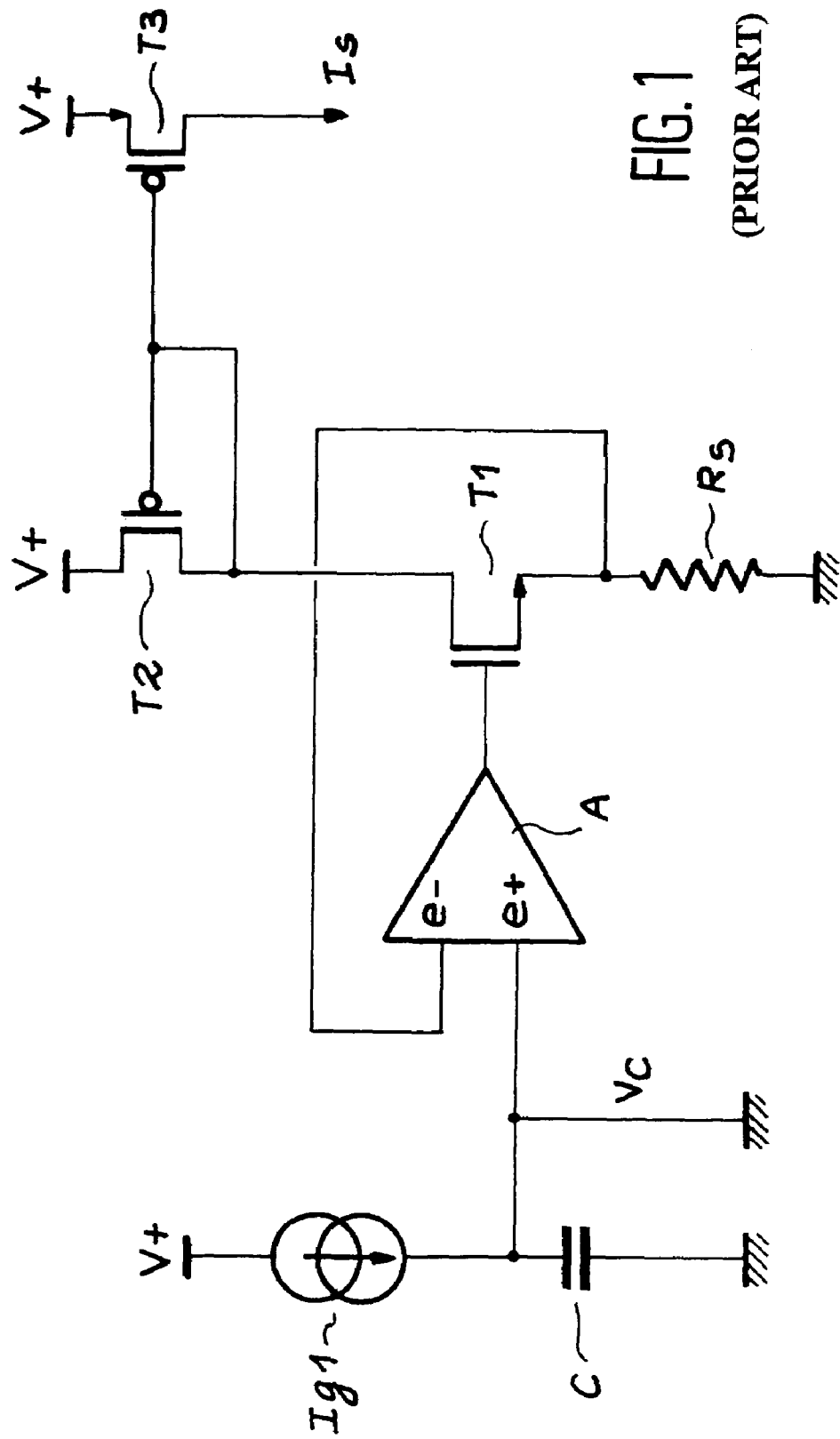
FIG. 1 shows a current ramp generator according to the prior art.

The circuit allowing the conversion of the voltage ramp into a current ramp is made up of operational amplifier A, three transistors T1, T2, T3 and a resistance Rs. The three transistors T1, T2, T3 and the resistance Rs are connected as shown in FIG. 1. Similarly, the first input (e−) of the operational amplifier A is connected to the source of transistor T1, the gate of which is connected to the output of the operational amplifier. The second input (e+) of the operational amplifier A is connected to a first terminal of the capacitance C. The second terminal of the capacitance C is connected to ground.

Since Is is the current passing through transistor T3, the current ramp $$\frac{\Delta Is}{\Delta t}$$

is written as:

$$\frac{\Delta Is}{\Delta t} = \frac{1}{Rs} \times \frac{\Delta Vc}{\Delta t},$$

where $$\frac{\Delta Vc}{\Delta t}$$

is the voltage ramp such as that calculated in the description of FIG. 2. Hence, all the advantages described for the voltage ramp generator circuit in FIG. 2 are also advantages that relate to the current ramp generator according to the invention.

As has already been previously mentioned, the voltage ramp $$\frac{\Delta Vc}{\Delta t}$$

varies with temperature according to $T^{1/2}$.

In accordance with the preferred embodiment of the invention, the resistance Rs is an implanted N-type resistance with a positive temperature variation coefficient that enables the temperature variation of the current ramp to vary according to $T^n$, where n is less than $$\frac{1}{2}.$$

To reduce the effect of component variations on the ramp, the capacitance C is the gate capacitance of a MOS transistor, the spread of which compensates for the spread of transistor T5.

What is claimed is:

1. An integrated circuit voltage ramp generator produced using CMOS technology and comprising:
   a capacitance; and
   a CMOS charging circuit connected to said capacitance and comprising
      a current generator having a first resistance, and
      a circuit connected to said current generator and to said capacitance, said circuit having a second resistance and enabling a capacitance charging current to be proportional to a square of a ratio of the second resistance and the first resistance.

2. A voltage ramp generator according to claim 1, wherein said CMOS charging circuit further comprises a degenerate current mirror circuit.

3. A voltage ramp generator according to claim 2, wherein said degenerate current mirror circuit comprises:
   a first MOS transistor having a channel of a first conductivity type comprising a gate, a drain and a source, the drain and the gate being connected to said current generator, and the source being connected to said second resistance; and
   a second MOS transistor having a channel of the first conductivity type comprising a gate, a drain and a source, the gate being connected to the gate of said first MOS transistor, the source being connected to a supply voltage, and the drain being connected to said capacitance.

4. A voltage ramp generator according to claim 3, wherein each of said first and second MOS transistors comprises a P-channel P405 transistor.

5. A voltage ramp generator according to claim 1, wherein said capacitance comprises a gate capacitance of a MOS transistor.

6. A voltage ramp generator according to claim 1, wherein current generated by said CMOS current generator is based upon the equation:

$$Ig2 = K2 \times \frac{Vg2}{Rg2}$$

where Ig2 is the current, K2 is a proportionality coefficient, Rg2 is the first resistance, and Vg2 is a reference voltage proportional to the quantity $$k\frac{T}{q},$$

where k is the Boltzmann constant, T is absolute temperature, and q is the charge of an electron.

7. An integrated circuit voltage ramp generator produced using CMOS technology and comprising:
   a capacitance; and
   a CMOS charging circuit connected to said capacitance and comprising
      a current generator having a first resistance, and
      a degenerate current mirror circuit connected to said current generator and to said capacitance, said degenerate current mirror circuit having a second resistance for generating a capacitance charging current that is proportional to a square of a ratio of the second resistance and the first resistance.

8. A voltage ramp generator according to claim 7, wherein said current generator has a first resistance, and said degenerate current mirror circuit has a second resistance such that the capacitance charging current is proportional to a square of a ratio of the second resistance and the first resistance.

9. A voltage ramp generator according to claim 7, wherein said degenerate current mirror circuit comprises:
- a first MOS transistor having a channel of a first conductivity type comprising a gate, a drain and a source, the drain and the gate being connected to said current generator, and the source being connected to said second resistance; and
- a second MOS transistor having a channel of the first conductivity type comprising a gate, a drain and a source, the gate being connected to the gate of said first MOS transistor, the source being connected to a supply voltage, and the drain being connected to said capacitance.

10. A voltage ramp generator according to claim 9, wherein each of said first and second MOS transistors comprises a P-channel MOS transistor.

11. A voltage ramp generator according to claim 7, wherein said capacitance comprises a gate capacitance of a MOS transistor.

12. A voltage ramp generator according to claim 7, wherein current generated by said current generator is based upon the equation:

$$Ig2 = K2 \times \frac{Vg2}{Rg2}$$

where Ig2 is the current, K2 is a proportionality coefficient, Rg2 is the first resistance, and Vq2 is a reference voltage proportional to the quantity $$k\frac{T}{q},$$

where k is the Boltzmann constant, T is absolute temperature, and q is the charge of an electron.

13. An integrated circuit current ramp generator produced using CMOS technology and comprising:
- a voltage ramp generator comprising
  - a capacitance, and
  - a CMOS charging circuit connected to said capacitance and comprising
    - a current generator having a first resistance, and
    - a circuit connected to said current generator and to said capacitance, said circuit having a second resistance and enabling a capacitance charging current to be proportional to a square of a ratio of the second resistance and the first resistance; and
- a conversion circuit connected to said voltage ramp generator for generating a current ramp and comprising an implanted resistance having a positive temperature coefficient.

14. An integrated circuit current ramp generator according to claim 13, wherein said CMOS charging circuit further comprises a degenerate current mirror circuit.

15. A current ramp generator according to claim 14, wherein said degenerate current mirror circuit comprises:
- a first MOS transistor having a channel of a first conductivity type comprising a gate, a drain and a source, the drain and the gate being connected to said current generator, and the source being connected to said second resistance; and
- a second MOS transistor having a channel of the first conductivity type comprising a gate, a drain and a source, the gate being connected to the gate of said first MOS transistor, the source being connected to a supply voltage, and the drain being connected to said capacitance.

16. A current ramp generator according to claim 15, wherein each of said first and second MOS transistors comprises a P-channel MOS transistor.

17. A current ramp generator according to claim 13, wherein said capacitance comprises a gate capacitance of a MOS transistor.

18. A current ramp generator according to claim 13, wherein current generated by said current generator is based upon the equation:

$$Ig2 = K2 \times \frac{Vg2}{Rg2}$$

where Ig2 is the current, K2 is a proportionality coefficient, Rg2 is the first resistance, and Vg2 is a reference voltage proportional to the quantity $$k\frac{T}{q},$$

where k is the Boltzmann constant, T is absolute temperature, and q is the charge of an electron.

19. An integrated circuit current ramp generator produced using CMOS technology and comprising:
- a voltage ramp generator comprising
  - a capacitance having a first resistance, and
  - a CMOS charging circuit connected to said capacitance and comprising
    - a current generator, and
    - a degenerate current mirror circuit connected to said current generator and to said capacitance, said degenerate current mirror circuit having a second resistance for generating a capacitance charging current that is proportional to a square of a ratio of the second resistance and the first resistance; and
- a third resistance connected to said voltage ramp generator for generating a current ramp, said third resistance comprising an implanted resistance having a positive temperature coefficient.

20. A current ramp generator according to claim 19, wherein said current generator has a first resistance, and said degenerate current mirror circuit has a second resistance such that the capacitance charging current is proportional to a square of a ratio of the second resistance and the first resistance.

21. A current ramp generator according to claim 19, wherein said degenerate current mirror circuit comprises:
- a first MOS transistor having a channel of a first conductivity type comprising a gate, a drain and a source, the drain and the gate being connected to said CMOS current generator, and the source being connected to said second resistance; and
- a second MOS transistor having a channel of the first conductivity type comprising a gate, a drain and a source, the gate being connected to the gate of said first MOS transistor, the source being connected to a supply voltage, and the drain being connected to said capacitance.

22. A current ramp generator according to claim 21, wherein each of said first and second MOS transistors comprises a P-channel MOS transistor.

23. A current ramp generator according to claim 19, wherein said capacitance comprises a gate capacitance of a MOS transistor.

24. A current ramp generator according to claim 19, wherein current generated by said current generator is based upon the equation:

$$Ig2 = K2 \times \frac{Vg2}{Rg2}$$

where Ig2 is the current, K2 is a proportionality coefficient, Rg2 is the first resistance, and Vg2 is a reference voltage proportional to the quantity $$k\frac{T}{q},$$

where k is the Boltzmann constant, T is absolute temperature, and q is the charge of an electron.

25. A method for generating a ramp voltage comprising:
generating a capacitance charging current using an integrated circuit charging circuit produced using CMOS technology and comprising a current generator having a first resistance and a circuit connected to the generator, the circuit having a second resistance and enabling the capacitance charging current to be proportional to a square of a ratio of the second resistance and the first resistance; and
charging a capacitance with the capacitance charging current for generating the ramp voltage.

26. A method according to claim 25, wherein the circuit further comprises a degenerate current mirror circuit.

27. A method according to claim 25, wherein current generated by the current generator is based upon the equation:

$$Ig2 = K2 \times \frac{Vg2}{Rg2}$$

where Ig2 is the current, K2 is a proportionality coefficient, Rg2 is the first resistance, and Vg2 is a reference voltage proportional to the quantity $$k\frac{T}{q},$$

where k is the Boltzmann constant, T is absolute temperature, and q is the charge of an electron.

* * * * *

UNITED STATES PATENT AND TRADEMARK OFFICE
CERTIFICATE OF CORRECTION

PATENT NO. : 6,989,694 B2 Page 1 of 1
APPLICATION NO. : 09/499060
DATED : January 24, 2006
INVENTOR(S) : Christophe Garnier and Pascal Debaty It is certified that error appears in the above-identified patent and that said Letters Patent is hereby corrected as shown below:

Column 6, Line 31,  Delete: "P405"

Insert: -- MOS --.

Signed and Sealed this

Fifth Day of September, 2006

JON W. DUDAS
*Director of the United States Patent and Trademark Office*